United States Patent [19]

Nishimura et al.

[11] Patent Number: 5,378,382

[45] Date of Patent: Jan. 3, 1995

[54] PIEZOELECTRIC CERAMIC COMPOSITION FOR ACTUATOR

[75] Inventors: Tetsuhiko Nishimura, Zama; Yukio Chida, Tokyo; Takahiro Choda, Sagamihara, all of Japan

[73] Assignee: Mitsubishi Kasei Corporation, Tokyo, Japan

[21] Appl. No.: 163,537

[22] Filed: Dec. 9, 1993

[51] Int. Cl.$^6$ .............................................. C04B 35/48
[52] U.S. Cl. .................................. 252/62.9; 501/136; 501/139
[58] Field of Search ................. 252/62.9; 501/136, 139

[56] References Cited

U.S. PATENT DOCUMENTS

| | | | |
|---|---|---|---|
| 2,960,411 | 11/1960 | Brajer et al. | 501/136 |
| 4,367,426 | 1/1983 | Kumada et al. | 252/62.9 |
| 4,716,134 | 12/1987 | Yamaguchi et al. | 501/136 |
| 4,812,698 | 3/1989 | Chida et al. | 310/330 |
| 4,843,046 | 6/1989 | Yamaguchi et al. | 501/139 |
| 4,882,078 | 11/1989 | Nishimura et al. | 252/62.9 |
| 4,994,703 | 2/1991 | Oguri et al. | 310/363 |
| 5,034,649 | 7/1991 | Chida et al. | 310/332 |
| 5,064,596 | 11/1991 | Chida et al. | 264/181 |
| 5,171,484 | 12/1992 | Nishimura et al. | 252/62.9 |
| 5,188,992 | 2/1993 | Nishimura et al. | 501/136 |

FOREIGN PATENT DOCUMENTS

| | | |
|---|---|---|
| 0549227 | 6/1993 | European Pat. Off. . |
| 50-83407 | 7/1975 | Japan . |
| 56-65117 | 6/1981 | Japan . |
| 61-91061 | 5/1986 | Japan . |
| 61-91062 | 5/1986 | Japan . |
| 64-14172 | 1/1989 | Japan . |
| 1-148749 | 6/1989 | Japan . |
| 1-148750 | 6/1989 | Japan . |
| 1-230125 | 9/1989 | Japan . |
| 2-82587 | 3/1990 | Japan . |
| 2-288381 | 11/1990 | Japan . |
| 3-104179 | 5/1991 | Japan . |
| 3-104180 | 5/1991 | Japan . |
| 5-218525 | 8/1993 | Japan . |

OTHER PUBLICATIONS

Journal of the American Ceramic Society, vol. 54, No. 1, Jan. 1971, pp. 1–11, "Hot-Pressed (Pb,La)(Zr,Ti)O3 Ferroelectric Ceramics for Electrooptic Applications" G. H. Haertling et al.

Ferroelectrics, 1982, vol. 41, pp. 143–156, S. Takahashi "Effects of Impurity Doping in Lead Zirconate-Titanate Ceramics".

*Primary Examiner*—Mark L. Bell
*Assistant Examiner*—Deborah Jones
*Attorney, Agent, or Firm*—Oblon, Spivak, McClelland, Maier & Neustadt

[57] ABSTRACT

The present invention relates to a piezoelectric ceramic composition for actuator which is a composition comprising a basic composition containing lead, lanthanum, alkali earth metals, zirconium, titanium and oxygen in the formulation represented by the following general formula (I):

$$Pb_{(1-x-m)}La_xA_m(Zr_yTi_{1-y})_{1-\frac{x}{4}}O_3, \quad (I)$$

where A represents one or more element(s) selected from the group consisting of Ba, Ca and Sr; $0 < x \leq 0.07$; $0.40 \leq y \leq 0.65$; and $0 < m \leq 0.15$, wherein the ceramic composition containing, relative to the basic composition, one or more element(s) selected from the group consisting of iron, aluminum, manganese, indium and tellurium in an amount of 0.02 to 0.3% by weight in terms of $Fe_2O_3$ or $Al_2O_3$, 0.02 to 0.2% by weight in terms of $MnO_2$ and 0.02 to 0.5% by weight in terms of $In_2O_3$ or $TeO_2$. The composition according to the present invention is higher in piezoelectric strain constant and in Curie point, so that the element can be used over a wide range of temperature. This makes the composition useful as the material for piezoelectric actuators, contributing to various industrial application fields.

9 Claims, No Drawings

PIEZOELECTRIC CERAMIC COMPOSITION FOR ACTUATOR

BACKGROUND OF THE INVENTION

This invention relates to a piezoelectric ceramic composition for an actuator and, in particular, to a piezoelectric ceramic composition that is extremely useful for piezoelectric actuators because of its higher piezoelectric strain constant, higher Curie point and lower relative dielectric constant.

Conventional design for some actuators uses an inverse piezoelectric effect that converts electric energy to mechanical energy. Actuators so designed are capable of producing fine movement in a precisely controlled manner in response to the application of voltage. Displacements of one micron or less are possible. This has contributed to the widespread usage of piezoelectric actuators in recent years. Such uses include precisely controlling acoustics or flow rate in buzzers, pumps and valves; auto-tracking and autofocusing in magnetic heads of video tape recorders, and precisely positioning mechanical cutting tools with the available maximum movements of less than one micron. Such actuators are also applicable to fine positioning devices for use in manufacturing semiconductors.

Lead zirconate titanate ceramics (called PZT) are known to exhibit superior piezoelectric properties when used as the piezoelectric material for actuators. PZT has been improved in various ways for individual applications.

The features and properties of piezoelectric materials used in PZT actuators have been improved by replacing a part of the lead zirconate titanate with trivalent ions such as $Bi^{3+}$, or by synthesizing solid solutions of a composite perovskite compound and a compound such as $Pb(Ni_{\frac{1}{3}}W_{\frac{1}{3}})O_3$, $Pb(CO_{\frac{1}{3}}Nb_{\frac{2}{3}})O_3$ or $Pb(Ni_{\frac{1}{3}}Nb_{\frac{2}{3}})O_3$.

Piezoelectric actuator elements for controlling fine displacement of approximately one micron or less may be any of three types: unimorphs, bimorphs and laminated. Such elements are required to have, as the inherent properties thereof, a higher piezoelectric strain constant as well as a higher Curie point. In other words, the piezoelectric strain constant $d_{31}$ of transversal mode and the Curie point Tc should be within the following values:

$$d_{31} > 300 \times 10^{-12} \text{ m/v}, \quad Tc > 150° \text{ C.,} \tag{1}$$

or $$d_{31} > 250 \times 10^{-12} \text{ m/v}, \quad Tc > 250° \text{ C.} \tag{2}$$

Materials having a piezoelectric strain constant $d_{31}$ of higher than $300 \times 10^{-12}$ m/v have a reduced Curie point (Tc) of around 100° C. Accordingly, the operating temperature of an element made from such materials has an upper limitation of 50° to 60° C., restricting the practical applications thereof. In addition, such actuator elements are disadvantageous in that the relative dielectric constant $\epsilon_{33}T/\epsilon_0$ is higher than 5,000 and the impedance thereof is thus likely to be reduced so as to cause the elements to heat when operated at a high frequency. Besides, the actuator element can only be operated with a driving power source having a large capacity. In addition, the use of ceramic materials having such a high piezoelectric strain constant $d_{31}$ places various practical restrictions on the use of actuator elements made therefrom because the relative dielectric constant and the piezoelectric strain constant of such materials are generally highly dependent on the temperature.

On the other hand, ceramic materials having a higher Curie point (Tc) are typically low in their piezoelectric strain constant ($d_{31}$). This means that an actuator element made of such material can only be operated with a high voltage.

DESCRIPTION OF THE PRIOR ART

According to Japanese Laid Open Patent No. 288381/1990, it is already known that the K constant (electromechanical factor) and the relative dielectric constant of a piezoelectric ceramic material are improved when either one of Nb, Sb, Ta or La is added to PZT, resulting in an increase of the piezoelectric strain constant. It is also shown that the relative dielectric constant can be improved by means of replacing Pb with Sr. While the effects on the piezoelectric properties of a single added element have been found, the specification says that the effect on piezoelectric properties is unknown when two or more of the aforesaid elements are added together.

THE INVENTION

The present invention comprises a piezoelectric ceramic composition of higher piezoelectric strain constant and higher Curie point. The composition is highly suitable for actuators. The piezoelectric ceramic compound is represented by the formula:

$$(Pb_{1-X}Sr_X)(Zr_YTi_{1-Y}M_Z)O_{3+Z},$$

where M represents one or more elements selected from the group consisting of Nb, Sb, Ta and La; $0.08 \leq X \leq 0.14$; $0.49 \leq Y - 0.5X \leq 0.51$; $0.005 \leq Z \leq 0.02$; and Z, is equal to $$\frac{3}{2} Z$$

when M is La and is equal to $$\frac{5}{2} Z$$

when M is either one of Sb, Ta and Nb.

The perovskite materials description used in this disclosure and in the claims is determined on the basis that the elements composing the composition are replaced with ions at the B-site of a perovskite structure ($ABO_3$) in the form of a solid solution. More particularly, the replacement elements of the composition are selected from the group consisting of niobium, antimony, tantalum and lanthanum while the ions at the B-site of perovskite structure ($ABO_3$) are those at the site of zirconium and titanium. The B-site corresponds to the crystallographic coordination of six-fold. When one considers the ionic radiis of the elements, (Zr 0.79 Å, Ti=0.68 Å, 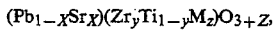 Nb=0.69 Å, Ta=0.68Å, $Sb^{3+}$ =0.76 Å, $Sb^{5+}$ =0.62 Å and La=1.14 Å) it is apparent that niobium, tantalum and antimony are similar in ionic radius to zirconium and titanium. Accordingly, the former may be replaced with the latter. However, lanthanum has an extremely large ionic radius more similar to that of lead and strontium (La=1.23 Å, Pb=1.29 Å and S~ =1.25 Å). The lanthanum ions are considered as being at the A-site in twelve-fold coordination occupied with lead. In other words, lanthanum, being similar in ionic radius to lead and strontium, is expected to be at the A-site because of crystallographic considerations.

In addition, Ferroelectrics, vol. 41, page 143 (1982) Journal of the American Ceramic Society, vol. 54, page 2 (1971) show that lanthanum is at the A-site. Accordingly, lanthanum should be considered to exhibit piezoelectric properties at the A-site rather than the B-site.

The temperature dependency of the relative dielectric constant and the piezoelectric strain constant (d constant) is an important factor that should be taken into consideration in deciding the applications of piezoelectric materials. In practice, a given amount of displacement can be achieved by controlled voltage within a smaller range when the relative dielectric constant and the d constant are less temperature dependent. The piezoelectric materials are advantageous because their displacement is less temperature dependent under a given voltage.

Tremendous study and effort has been devoted by the present inventors towards these issues and, as a result, the composition according to the present invention has been obtained by means of replacing lead ions at the A-site with one or more ions of alkaline earth metals selected from the group consisting of lanthanum, strontium, barium and calcium. The ceramic composition of this invention has been found to be an excellent material that has a higher piezoelectric strain constant and higher Curie point, coexistent with a relative dielectric constant and piezoelectric strain constant which are less temperature dependent.

Some of the present inventors have previously suggested a composition where antimony is added as a minor component to the major component represented by

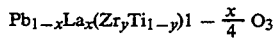

(Japanese Patent Laid Open No. 104179/1991 corresponding to U.S. Pat. No. 5,171,484) and a composition represented by

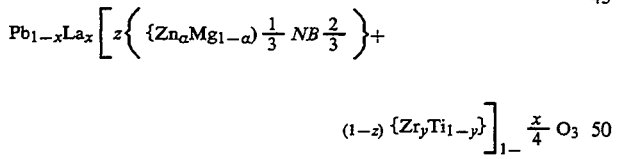

(Japanese Patent Laid Open No. 148749/1989 corresponding to U.S. Pat. No. 4,882,078).

These compositions can provide a material having higher piezoelectric strain constant as well as higher Curie point. However, the material may be unsuitable depending on the application thereof because the relative dielectric constant and the piezoelectric strain constant are greatly temperature dependent. In other words, the relative dielectric constant and the piezoelectric strain constant of these compositions are more likely to be changed as the temperature increases or decreases. Accordingly, development of a novel material has been desired that has higher piezoelectric strain constant ($d_{31}$) of transversal mode, higher Curie point (Tc) and lower relative dielectric constant (e.g., $\epsilon_{33}T/\epsilon_0 < 5,000$) while the relative dielectric constant and the piezoelectric strain constant thereof are less temperature dependent.

It is an object of this invention to provide a piezoelectric ceramic composition for actuators which is extremely useful for various piezoelectric material applications.

It is another object of the present invention to provide a piezoelectric ceramic composition that is useful as a material having a higher electromechanical coupling factor, higher piezoelectric strain constant, lower relative dielectric constant and higher Curie point while the relative dielectric constant and the piezoelectric strain constant thereof are less temperature dependent.

The present inventors have been found that, as mentioned above, the composition according to the present invention, obtained by means of replacing lead ions at the A-site of a perovskite structure with one or more alkaline earth ions selected from the group consisting of lanthanum, strontium, barium and calcium, is an excellent material that has a higher piezoelectric strain constant and higher Curie point coexistent with such properties that the relative dielectric constant and the piezoelectric strain constant is less temperature dependent.

SUMMARY OF THE INVENTION

The present invention is directed to a piezoelectric ceramic composition for an actuator which is a ceramic composition comprising a basic composition represented by the following general formula (I). The ceramic composition contains, relative to the basic composition, one or more element(s) selected from the group consisting of iron, aluminum, manganese, indium and tellurium. The contents thereof are in the range of 0.02 to 0.3% by weight in terms of $Fe_2O_3$ or $Al_2O_3$, 0.02 to 0.2% by weight in terms of $MnO_2$ and 0.02 to 0.5% by weight in terms of $In_2O_3$ or $TeO_2$.

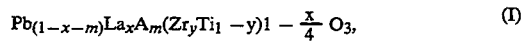 (I)

wherein A represents one or more elements selected from the group consisting of Ba, Ca and Sr; $0 < x \leq 0.07$; $0.40 \leq y \leq 0.65$; and $0 < m \leq 0.15$).

In addition, the present invention is directed to a piezoelectric ceramic composition for actuators comprising, as a major component, the above mentioned piezoelectric ceramic composition for actuators and comprising, as a minor component, one or more elements selected from the group consisting of antimony, niobium and tantalum in an amount of 0 to 3% by weight in terms of $Sb_2O_5$, $Nb_2O_5$ or $Ta_2O_5$ relative to the major component.

DESCRIPTION OF THE PREFERRED EMBODIMENT

The present invention is now described further in detail with the amounts of iron, aluminum, manganese, indium, tellurium, antimony, niobium and tantalum, in terms of $Fe_2O_3$, $Al_2O_3$, $MnO_2$, $In_2O_3$, $TeO_2$, $Sb_2O_5$, $Nb_2O_5$ and $Ta_2O_5$, respectively, being simply referred to as "$Fe_2O_3$ loadings," "$Al_2O_3$ loadings," "$MnO_2$ loadings," "$In_2O_3$ loadings," "$TeO_2$ loadings," "$Sb_2O_5$ loadings," "$Nb_2O_5$ loadings" and "$Ta_2O_5$ loadings."

The ceramic composition according to the present invention has a higher piezoelectric strain constant and lower relative dielectric constant as well as higher Curie point. It is specifically possible to overcome the above mentioned problems with the composition near the morphotropic phase boundary (MPB) of a perovskite crystal in the range of $0.03 \leq x \leq 0.06$ in the above formula (I). The latter composition has the piezoelectric strain constant ($d_{31}$) of transversal mode exceeding $300 \times 10^{-12}$ m/v, the relative dielectric constant ($\epsilon_{33}^T/\epsilon_0$) of less than 5000 and the Curie point (Tc) of as high as 150° C. or more. Such composition is thus particularly suitable as the material for piezoelectric actuators.

In particular, the following compositions (1) through (6) are extremely suitable as the material for piezoelectric actuators because the piezoelectric strain constant ($d_{31}$) of transversal mode exceeds $350 \times 10^{-12}$ m/v and the Curie point (Tc) is not lower than 200° C. while the relative dielectric constant ($\epsilon_{33}^T/\epsilon_0$) is less than 5000:

(1) x=0.06, y=0.58, A=Ba, m=0.01, Fe$_2$O$_3$ loadings=0.15% by weight and Sb$_2$O$_5$ loadings 0.20% by weight (Example 4 below);

(2) x=0.06, y=0.58, A=Ba, m=0.01, Fe$_2$O$_3$ loadings= 0.10% by weight and Nb$_2$O$_5$ loadings=0.20% by weight (Example 5 below);

(3) x=0.06, y=0.58, A=Ba, m=0.01, Fe$_2$O$_3$ loadings=0.10% by weight and Ta$_2$O$_5$ loadings=0.20% by weight (Example 6 below);

(4) x=0.05, y=0.565, A=Ba, m=0.01, Fe$_2$O$_3$ loadings=0.05% by weight and Sb$_2$O$_5$ loadings=0.9% by weight (Example 7 below);

(5) x=0.05, y=0.57, A=Ca, m=0.01, Fe$_2$O$_3$ loadings=0.05% by weight and Sb$_2$O$_5$ loadings=0.60% by weight (Example 8 below); and (6) x=0.035, y=0.57, A=Sr, m 0.08, Fe$_2$O$_3$ loadings=0.10% by weight and Nb$_2$O$_5$ loadings=0.10% by weight (Example 12 below).

Further, the following composition (7) and Examples 20 through 23 shown below are exceptionally favorable materials as the highly displaceable materials that can be used under the high temperature conditions:

(7) x=0.02, y=0.525, A=Ba, m=0.01, Fe$_2$O$_3$ loadings=0.1% by weight and Sb$_2$O$_5$ loadings=2.0% by weight ( Example 15 below).

The other feature of the present composition is its superior temperature characteristics, more particularly, the composition obtained in Example 27 below according to the present invention is smaller in the amount of change in the piezoelectric strain constant ($d_{31}$) at 25° C. and 100° C. as compared with the conventional composition of the same degree. For example, Table 3 shows the relative dielectric constant and the piezoelectric strain constant at 25° C. and 100° C. of the composition obtained in Example 7. This piezoelectric strain constant $d_{31}$ is exceptionally high and can be favorably used in materials for actuator. The piezoelectric strain constant ($d_{31}$) of the same degree is achieved with the compositions in Examples 9 and 10 corresponding to Japanese Patent Laid Open Nos. 104179/1991 and 148749/1989, respectively. As apparent from Table 3, the compositions in Examples 9 and 10 are higher in the amount of change (100° C./25° C.) in the relative dielectric constant and the piezoelectric strain constant ($d_{31}$) as compared with that in Example 7. This means that the compositions in Example 9 and 10 are more dependent on temperature and are large in the absolute value of the relative dielectric constant.

Table 4 shows the temperature dependency of the compositions each of which contains a different alkaline earth metal from that contained in Example 7. The choice of different alkaline earth metals results in the change of the piezoelectric strain constant $d_{31}$) and simultaneously in the change, in great degree, of the temperature dependency of the relative dielectric constant and the piezoelectric strain constant $d_{31}$).

As more clearly apparent below, compositions with lanthanum loadings x of larger than 7 mol % are improper as materials for a piezoelectric actuator because the Curie point (Tc) thereof is lower than 150° C. (see, Controls 2, 3 and 4 below). In addition, compositions with barium, calcium and/or strontium loadings m of larger than 15 mol % are improper as materials for a piezoelectric actuator because the Curie point (Tc) is lower than 150° C. (see, Controls 5, 6 and 7 below). Further, the zirconium/titanium ratio deviates greatly from the morphotropic phase boundary of the perovskite crystals in compositions with zirconium loadings y of less than 40 mol % and more than 65 mol %, which causes the piezoelectric strain constant ($d_{31}$) to be decreased.

Compositions in which Fe$_2$O$_3$ loadings or Al$_2$O$_3$ loadings relative to the basic composition represented by the general formula (I) are more than 0.3% by weight (see Controls 8 and 9 below) are lower in the piezoelectric strain constant ($d_{31}$) of the transversal mode as compared with the composition containing no Fe and Al (Reference 1 below). In other words, addition of iron or aluminum has achieved no effect on those compositions. This leads to the conclusion that a sufficient Fe$_2$O$_3$ loading or Al$_2$O$_3$ loading is 0.3% by weight or less.

Compositions in which the MnO$_2$ loading relative to the basic composition represented by the general formula (I) is more than 0.2% by weight (see Controls 10 below) are lower in piezoelectric strain constant $d_{31}$) Of the transversal mode as compared with compositions containing no manganese (Reference 1 below). This means that additional MnO$_2$ over the 0.2% loading exhibits no effect. Thus MnO$_2$ loading of 0.2% by weight or less is sufficient.

The compositions of which the In$_2$O$_3$ loadings or TeO$_2$ loading relative to the basic composition represented by the general formula (I) is more than 0.5% by weight (see Controls 14 and 15 below) are lower in the piezoelectric strain constant ($d_{31}$) of the transversal mode as compared with the composition containing no indium and tellurium (Reference 1 below). In other words, the additional indium and tellurium over 0.5% by weight has achieved no effect on those compositions. This leads to the conclusion that In$_2$O$_3$ loadings or TeO$_2$ loadings of 0.5% by weight or less are sufficient.

Moreover, the piezoelectric strain constant is also decreased with compositions containing loadings of one or more elemental oxides selected from the group consisting of Sb$_2$O$_5$, Nb$_2$O$_5$ and Ta$_2$O$_5$, in an amount more than 3.0% by weight relative to the major component (see Controls 11, 12 and 13 below). For these compositions, a presence of the pyrochlore phase is observed in the sintered body thereof and these compositions are thus unsuitable as materials for piezoelectric actuators.

The compositions according to the present invention can be prepared by weighing the starting oxide materials of each component into a predetermined formulation; wet blending and calcining the same in a ball-mill or the like; grinding the calcined material and sintering the resultant powders at 1,100° to 1,300° C. While Sb$_2$O$_5$ is used as the source of antimony in the Examples below, it may be in the form of Sb$_2$O$_3$. Likewise, Mno may be used rather than MnO$_2$ used in the present Examples.

As described above, the piezoelectric ceramic composition according to the present invention has a higher electro-mechanical coupling factor, a higher piezoelectric strain constant and is characterized by a lower relative dielectric constant and a higher Curie point. It can be used effectively as the piezoelectric materials in various forms. Because the piezoelectric ceramic composition for actuator according to the present invention is higher in piezoelectric strain constant and in Curie point, actuator elements prepared therefrom can be used over a wide range of temperatures. This makes the composition useful as a material for a piezoelectric actuator, in various industrial application fields.

The foregoing features of the present invention will be more readily apparent in the context of a specifically delineated set of examples, controls and a reference. However, it should be understood that the present invention is not restricted by the specific examples.

Examples 1 through 9, Reference 1 and Controls 1 through 15

Highly pure oxides of purity of 99.9% or more, PbO, $La_2O_3$, $TiO_2$, $ZrO_2$, $Sb_2O_5$, $Nb_2O_5$, $Ta_2O_5$, $Fe_2O_3$, $Al_2O_3$, $MnO_2$, $In_2O_3$, $TeO_2$ and $BaCO_3$, $CaCO_3$ or $SrCO_3$, are used as the starting materials. The starting oxide materials were weighed into a predetermined formulation, following which they are wet blended for 24 hours in a ball-mill. The resultant material was then dried and molded. The molding was calcined at 900° C. for 2 hours. The calcined material was ground in a mortar and again wet ground in a ball-mill for 24 hours. The powders obtained were subjected to hydrostatic molding using the rubber press technique and sintered at 1,200° C. in a lead atmosphere. The sintered body obtained was processed into a disk and a stick with a slicing machine. Subsequently, Ag paste was screen printed on the disk and the stick, which were then baked at 550° C. to form electrodes. The polarization was generated at the electric field strength of 2.0 to 3.0 kV/mm, for 15 to 20 minutes in a silicon oil of between 80° to 110° C. in temperature. After one day, the piezoelectric properties, i.e., the relative dielectric constant ($\epsilon_{33}^T/\epsilon_0$) at 1 kHz, the dielectric loss (tan δ) at 1 kHz, the electromechanic coupling factor ($K_{31}$) of transversal mode and the piezoelectric strain constant ($d_{31}$) of transversal mode, were measured and determined according to the resonance-antiresonance method using a vector impedance analyzer (at the measurement temperature of 25° C). In addition, the temperature characteristics if the relative dielectric constant were also determined. The Curie point (Tc) was obtained in accordance with the maximum of the relative dielectric constant. The results are set forth in Table 1 and Table 2.

Example 24

To determine the temperature characteristics of the piezoelectric ceramic compositions, the relative dielectric constant and the piezoelectric strain constant ($d_{31}$) of transversal mode were measured at 25° C. and 100° C. on the piezoelectric ceramic compositions in Examples 7, 20, 21, 22 and 23. The amount of change thereof (the value at 100° C./value at 25° C.) was calculated. For the purpose of comparison, the relative dielectric constant and the piezoelectric strain constant ($d_{31}$) of transversal mode were measured in the same manner at 25° C. and 100° C. on the piezoelectric ceramic compositions disclosed in the prior arts. The change of the amount thereof were also calculated. The results are set forth in Table 3 and Table 4.

As apparent from Table 3, the change amount of the composition according to the present invention is smaller than that in the piezoelectric ceramic compositions disclosed in the prior arts. This means that the properties of the present composition are less affected by temperature, so that the present composition is superior in its temperature characteristics.

TABLE 1

| | Major Component | | | | | | | | | | | | |
|---|---|---|---|---|---|---|---|---|---|---|---|---|---|
| | Basic Composition | | | | Fe, Al, Mn, In, Te Loadings | | Minor Component Loadings | | Sintered Density | $\epsilon_{33}^T/\epsilon_0$ | tan δ | $K_{31}$ | d31 | Tc |
| Case | x | y | A | m | Type | (wt. %) | Type | (wt. %) | (*1) | | | | (*2) | (*3) |
| EXAMPLES | | | | | | | | | | | | | | |
| 1 | 0.06 | 0.58 | Ba | 0.01 | $Fe_2O_3$ | 0.10 | None | 0 | 7.76 | 4200 | 0.018 | 0.446 | 346 | 214 |
| 2 | 0.06 | 0.58 | Ba | 0.01 | $Al_2O_3$ | 0.05 | None | 0 | 7.74 | 3995 | 0.019 | 0.454 | 339 | 210 |
| 3 | 0.06 | 0.58 | Ba | 0.01 | $MnO_2$ | 0.05 | None | 0 | 7.84 | 4120 | 0.011 | 0.441 | 340 | 211 |
| 4 | 0.06 | 0.58 | Ba | 0.01 | $Fe_2O_3$ | 0.15 | $Sb_2O_5$ | 0.20 | 7.79 | 4740 | 0.018 | 0.439 | 362 | 200 |
| 5 | 0.06 | 0.58 | Ba | 0.01 | $Fe_2O_3$ | 0.10 | $Nb_2O_5$ | 0.20 | 7.79 | 4680 | 0.019 | 0.433 | 357 | 205 |
| 6 | 0.06 | 0.58 | Ba | 0.01 | $Fe_2O_3$ | 0.10 | $Nb_2O_5$ | 0.20 | 7.79 | 4650 | 0.019 | 0.431 | 355 | 204 |
| 7 | 0.05 | .565 | Ba | 0.01 | $Fe_2O_3$ | 0.05 | $Ta_2O_5$ | 0.90 | 7.79 | 4177 | 0.020 | 0.475 | 380 | 202 |
| 8 | 0.05 | 0.57 | Ca | 0.01 | $Fe_2O_3$ | 0.05 | $Sb_2O_5$ | 0.60 | 7.80 | 4160 | 0.017 | 0.451 | 351 | 209 |
| 9 | .035 | .535 | Ba | 0.10 | $Fe_2O_3$ | 0.10 | None | 0 | 7.79 | 3800 | 0.021 | 0.426 | 308 | 224 |
| 10 | .035 | .535 | Ba | 0.10 | $Fe_2O_3$ | 0.10 | $Nb_2O_5$ | 0.10 | 7.79 | 3900 | 0.021 | 0.430 | 320 | 220 |
| 11 | .035 | .565 | Sr | 0.08 | $Fe_2O_3$ | 0.10 | None | 0 | 7.78 | 4070 | 0.020 | 0.435 | 331 | 205 |
| 12 | .035 | 0.57 | Sr | 0.08 | $Fe_2O_3$ | 0.10 | $Nb_2O_5$ | 0.10 | 7.79 | 4220 | 0.020 | 0.452 | 351 | 202 |
| 13 | .035 | .515 | Ca | 0.10 | $Fe_2O_3$ | 0.10 | $Nb_2O_5$ | 0.10 | 7.79 | 4230 | 0.021 | 0.447 | 347 | 201 |
| 14 | 0.03 | 0.53 | Ba | 0.01 | $Fe_2O_3$ | 0.05 | $Sb_2O_5$ | 2.0 | 7.82 | 3320 | 0.017 | 0.446 | 305 | 225 |
| 15 | 0.02 | .525 | Ba | 0.01 | $Fe_2O_3$ | 0.10 | $Sb_2O_5$ | 2.0 | 7.82 | 2490 | 0.015 | 0.442 | 262 | 255 |
| 16 | 0.06 | 0.58 | Ba | 0.01 | $In_2O_3$ | 0.20 | None | 0 | 7.75 | 3850 | 0.019 | 0.455 | 338 | 210 |
| 17 | 0.06 | 0.58 | Ba | 0.01 | $TeO_2$ | 0.20 | None | 0 | 7.74 | 3930 | 0.020 | 0.452 | 340 | 209 |
| 18 | 0.03 | 0.56 | Ba Ca | .015 .015 | $Al_2O_3$ | 0.05 | $Nb_2O_5$ | 0.4 | 7.71 | 2810 | 0.020 | 0.432 | 272 | 254 |
| 19 | 0.03 | .565 | Ca | 0.03 | $Al_2O_3$ | 0.05 | $Nb_2O_5$ | 0.4 | 7.71 | 2890 | 0.020 | 0.434 | 276 | 248 |
| 20 | 0.04 | .555 | Sr | 0.02 | $Fe_2O_3$ | 0.10 | $Nb_2O_5$ | 0.4 | 7.74 | 2920 | 0.021 | 0.430 | 280 | 252 |
| 21 | 0.04 | .550 | Ba | 0.02 | $Fe_2O_3$ | 0.10 | $Nb_2O_5$ | 0.4 | 7.73 | 2740 | 0.020 | 0.428 | 274 | 257 |
| 22 | 0.04 | .560 | Ca | 0.02 | $Fe_2O_3$ | 0.10 | $Nb_2O_5$ | 0.4 | 7.73 | 2790 | 0.020 | 0.429 | 275 | 254 |
| 23 | 0.04 | .555 | Sr | 0.01 | $Fe_2O_3$ | 0.10 | $Nb_2O_5$ | 0.4 | 7.74 | 2820 | 0.020 | 0.430 | 279 | 253 |

TABLE 1-continued

| | Major Component | | | | Fe, Al, Mn, In, Te | | Minor Component | | Sintered Density | | | | d31 | Tc |
|---|---|---|---|---|---|---|---|---|---|---|---|---|---|---|
| | Basic Composition | | | | | Loadings | | Loadings | | | | | | |
| Case | x | y | A | m | Type | (wt. %) | Type | (wt. %) | (*1) | $\epsilon 33^T/\epsilon 0$ | tan δ | K31 | (*2) | (*3) |
| | | | Ca | 0.01 | | | | | | | | | | |

*1 g/cm²
*2 ×10⁻¹² m/v
*3 °C.

TABLE 2

| | Major Component | | | | Fe, Al, Mn, In, Te | | Minor Component | | Sintered Density | $\epsilon 33^T/$ | | | d31 | Tc |
|---|---|---|---|---|---|---|---|---|---|---|---|---|---|---|
| | Basic Composition | | | | | Loadings | | Loadings | | | | | | |
| Case | x | y | A | m | Type | (wt. %) | Type | (wt. %) | (*1) | ε0 | tan δ | K31 | (*2) | (*3) |
| #1 CONTROLS | 0.06 | 0.58 | Ba | 0.01 | None | 0 | None | 0 | 7.74 | 4020 | 0.018 | 0.440 | 332 | 210 |
| 1 | 0.06 | 0.58 | None | 0 | None | 0 | None | 0 | 7.74 | 3620 | 0.022 | 0.419 | 291 | 220 |
| 2 | 0.08 | 0.62 | None | 0 | None | 0 | None | 0 | 7.73 | Not measured because Tc < 150° C. | | | | 137 |
| 3 | 0.08 | 0.62 | Ba | 0.07 | Fe₂O₃ | 0.1 | None | 0 | 7.72 | Not measured because Tc < 150° C. | | | | 94 |
| 4 | 0.08 | 0.62 | Ca | 0.07 | Fe₂O₃ | 0.1 | None | 0 | 7.73 | Not measured because Tc < 150° C. | | | | 84 |
| 5 | .035 | .530 | Ba | 0.20 | Fe₂O₃ | 0.1 | None | 0 | 7.75 | Not measured because Tc < 150° C. | | | | 145 |
| 6 | .035 | .515 | Ca | 0.20 | Fe₂O₃ | 0.1 | None | 0 | 7.76 | Not measured because Tc < 150° C. | | | | 101 |
| 7 | .035 | .565 | Sr | 0.20 | Fe₂O₃ | 0.1 | None | 0 | 7.76 | Not measured because Tc < 150° C. | | | | 76 |
| 8 | 0.06 | 0.58 | Ba | 0.01 | Fe₂O₃ | 0.5 | None | 0 | 7.78 | 3300 | 0.021 | 0.425 | 291 | 221 |
| 9 | 0.06 | 0.58 | Ba | 0.01 | Al₂O₃ | 0.5 | None | 0 | 7.79 | 2650 | 0.022 | 0.405 | 240 | 220 |
| 10 | 0.06 | 0.58 | Ba | 0.01 | MnO₃ | 0.3 | None | 0 | 7.86 | 2805 | 0.008 | 0.370 | 213 | 215 |
| 11 | 0.06 | 0.58 | Ba | 0.01 | Fe₂O₃ | 0.1 | Sb₂O₅ | 3.5 | 7.76 | Not measured because pyrochlore phase was generated | | | | |
| 12 | 0.06 | 0.58 | Ba | 0.01 | Fe₂O₃ | 0.1 | Nb₂O₅ | 3.5 | 7.75 | Not measured because pyrochlore phase was generated | | | | |
| 13 | 0.06 | 0.58 | Ba | 0.01 | Nb₂O₅ | 0.1 | Ta₂O₅ | 3.5 | 7.76 | Not measured because pyrochlore phase was generated | | | | |
| 14 | 0.06 | 0.58 | Ba | 0.01 | In₂O₃ | 0.6 | None | 0 | 7.74 | 3330 | 0.021 | 0.395 | 260 | 228 |
| 15 | 0.06 | 0.58 | Ba | 0.01 | TeO₂ | 0.6 | None | 0 | 7.73 | 3420 | 0.020 | 0.394 | 261 | 226 |

Reference; *1 g/cm²; *2 ×10⁻¹² m/v; *3 °C.

TABLE 3

| | 25° C. | | 100° C. | | Amount of Change (100° C./25° C.) | | Tc |
|---|---|---|---|---|---|---|---|
| Compositions | $\epsilon 33^T/\epsilon 0$ | d31 (×10⁻¹² m/v) | $\epsilon 33^T/\epsilon 0$ | d31 (×10⁻¹² m/v) | $\epsilon 33^T/\epsilon 0$ | d31 (×10⁻¹² m/v) | (°C.) |
| Example 7 | 4177 | 380 | 6010 | 453 | 1.439 | 1.192 | 202 |
| Control 14*¹ | 5436 | 377 | 9020 | 477 | 1.659 | 1.265 | 177 |
| Control 15*² | 4807 | 385 | 7680 | 475 | 1.597 | 1.234 | 183 |

TABLE 4

| | 25° C. | | 100° C. | | Amount of Change (100° C./25° C.) | | Tc |
|---|---|---|---|---|---|---|---|
| Compositions | $\epsilon 33^T/\epsilon 0$ | d31 (×10⁻¹² m/v) | $\epsilon 33^T/\epsilon 0$ | d31 (×10⁻¹² m/v) | $\epsilon 33^T/\epsilon 0$ | d31 (×10⁻¹² m/v) | (°C.) |
| Example 20 | 2920 | 280 | 3970 | 316 | 1.360 | 1.129 | 252 |
| Example 21 | 2740 | 274 | 3450 | 300 | 1.259 | 1.095 | 257 |
| Example 22 | 2890 | 275 | 3580 | 294 | 1.238 | 1.069 | 254 |
| Control 23 | 2820 | 279 | 3511 | 299 | 1.245 | 1.072 | 253 |
| Control 16*³ | 3005 | 276 | 4180 | 327 | 1.391 | 1.185 | 252 |

*¹Composition in Example 10 disclosed in Japanese Patent Laid Open No. 148749/1989 Pb₀.₉₄La₀.₀₆[0.1{(Zn₀.₃Mg₀.₇)⅓Nb⅔} + 0.9{Zr₀.₅₆₅Ti₀.₄₃₅}]₁₋₀.₀₆/₄O₃
*²Composition in Example 9 disclosed in Japanese Patent Laid open No. 104179/1991 0.5% by weight of antimony in the form of Sb₂O₅ was added to Pb₀.₉₃La₀.₀₇[Zr₀.₆₀Ti₀.₄₀]₁₋₀.₀₇/₄O₃
*³Composition in Example 3 disclosed in Japanese Patent Laid Open No. 104179/1991 2.0% by weight of antimony in the form of Sb₂O₅ was added to Pb₀.₉₇La₀.₀₃[Zr₀.₅₃Ti₀.₄₇]₁₋₀.₀₃/₄O₃

What is claimed is:

1. A piezoelectric ceramic composition for an actuator, said composition comprising a basic composition containing lead, lanthanum, alkaline earth metals, zirconium, titanium and oxygen in the formulation represented by the following general formula (I):

$$Pb_{(1-x-m)}La_xA_m(Zr_yTi_{1-y})_{1-\frac{x}{4}}O_3, \quad (I)$$

where A represents one or more elements selected from the group consisting of Ba, Ca and Sr; $0 < x \leq 0.07$; $0.40 \leq y \leq 0.65$; and $0 < m \leq 0.15$; and wherein the ceramic composition contains, relative to the basic composition, one or more elements selected from the group consisting of iron, aluminum, manganese, indium and tellurium in an amount of 0.02 to 0.3% by weight in terms of $Fe_2O_3$ or $Al_2O_3$, 0.02 to 0.2% by weight in terms of $MnO_2$ and 0.02 to 0.5% by weight in terms of $In_2O_3$ or $TeO_2$.

2. A piezoelectric ceramic composition for an actuator comprising, as a major component, the ceramic composition as claimed in claim 1 and comprising, as a minor component, one or more elements selected from the group consisting of antimony, niobium and tantalum in an amount of 0 to 3% by weight in terms of $Sb_2O_5$, $Nb_2O_5$ or $Ta_2O_5$ relative to the major component.

3. A piezoelectric ceramic composition for an actuator as claimed in claim 1 or 2, wherein A in the general formula (I) represents Ba.

4. A piezoelectric ceramic composition for an actuator as claimed in claim 1 or 2, wherein A in the general formula (I) represents Ca.

5. A piezoelectric ceramic composition for an actuator as claimed in claim 1 or 2, wherein A in the general formula (I) represents Sr.

6. A piezoelectric ceramic composition for an actuator as claimed in claim 1 or 2, wherein A in the general formula (I) represents two elements selected from the group consisting of Ba, Ca and Sr.

7. A piezoelectric ceramic composition for an actuator as claimed in claim 1 or 2, wherein A in the general formula (I) represents Ba, Ca and Sr.

8. A piezoelectric ceramic composition for an actuator as claimed in claim 1 or 2 which is a composition comprising a basic composition represented by the general formula (I) and which contains, relative to the basic composition, one or more element(s) selected from the group consisting of iron, aluminium, manganese.

9. A piezoelectric ceramic composition for an actuator as claimed in claim 1 or 2 which contains, as the minor component, either one of or both elements selected from the group consisting of antimony and niobium.

* * * * *